US010825701B2

(12) United States Patent
George et al.

(10) Patent No.: US 10,825,701 B2
(45) Date of Patent: Nov. 3, 2020

(54) BAKING DEVICE FOR A WAFER COATED WITH A COATING CONTAINING A SOLVENT

(71) Applicant: SUSS MicroTec Lithography GmbH, Garching (DE)

(72) Inventors: Gregory George, Colchester, VT (US); Aaron Foley, Jericho, VT (US); Oliver Treichel, Stuttgart (DE)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 309 days.

(21) Appl. No.: 14/948,877

(22) Filed: Nov. 23, 2015

(65) Prior Publication Data
US 2016/0148823 A1    May 26, 2016

(30) Foreign Application Priority Data
Nov. 25, 2014 (DE) .................. 10 2014 117 228

(51) Int. Cl.
| | |
|---|---|
| *H01L 21/67* | (2006.01) |
| *F27D 3/00* | (2006.01) |
| *F27B 3/02* | (2006.01) |

(52) U.S. Cl.
CPC .......... *H01L 21/67103* (2013.01); *F27B 3/02* (2013.01); *F27D 3/0084* (2013.01); *H01L 21/6719* (2013.01); *H01L 21/67109* (2013.01)

(58) Field of Classification Search
CPC ......... H01L 21/67103; H01L 21/67109; H01L 21/6719; F27B 3/02; F27D 3/0084
USPC .............................. 432/201; 219/400, 444.1
See application file for complete search history.

(56) References Cited

U.S. PATENT DOCUMENTS

| | | | |
|---|---|---|---|
| 3,405,454 A | * | 10/1968 | Zeff .......................... B64G 1/60 203/DIG. 5 |
| 4,793,283 A | | 12/1988 | Sarkozy |
| 4,820,371 A | * | 4/1989 | Rose ................... H01J 37/3244 118/50.1 |
| 5,595,602 A | | 1/1997 | Harlan |
| 6,454,863 B1 | | 9/2002 | Halpin |
| 7,256,370 B2 | | 8/2007 | Guiver |
| 7,351,936 B1 | | 4/2008 | Chang |

(Continued)

FOREIGN PATENT DOCUMENTS

| | | |
|---|---|---|
| EP | 1411543 B1 | 3/2006 |
| JP | H0645335 A | 2/1994 |

(Continued)

OTHER PUBLICATIONS

German Search Report, German Application No. 10 2014 117 228.0, dated Jul. 23, 2015, 9 pages.

*Primary Examiner* — Steven B McAllister
*Assistant Examiner* — John E Bargero
(74) *Attorney, Agent, or Firm* — Hayes Soloway PC

(57) ABSTRACT

A baking device for a wafer coated with a coating containing a solvent is described, having a baking chamber, a support for the wafer, an inlet for a purge gas, and an evacuation for the purge gas charged with solvent evaporated from the coating. The inlet is formed as a diffusion element arranged above the wafer so as to admit the purge gas evenly over substantially the entire surface of the wafer, and the evacuation is formed as an evacuation ring which radially surrounds the diffusion element and is arranged at a ceiling of the baking chamber.

14 Claims, 4 Drawing Sheets

(56) References Cited

U.S. PATENT DOCUMENTS

| | | | |
|---|---|---|---|
| 2004/0231799 A1* | 11/2004 | Lee | C23C 16/4412 |
| | | | 156/345.34 |
| 2005/0244759 A1 | 11/2005 | Lee | |
| 2006/0151462 A1 | 7/2006 | Lee et al. | |
| 2007/0166655 A1* | 7/2007 | Ooshima | H01L 21/67017 |
| | | | 432/120 |
| 2009/0000742 A1 | 1/2009 | Okesaku et al. | |
| 2011/0092075 A1 | 4/2011 | Suzuki et al. | |
| 2013/0078816 A1 | 3/2013 | Hirano | |

FOREIGN PATENT DOCUMENTS

| | | |
|---|---|---|
| JP | H06112116 A | 4/1994 |
| JP | 2002313701 A | 10/2002 |
| JP | 2003068725 A | 3/2003 |
| JP | 2004165614 A | 6/2004 |
| JP | 2007194269 A | 8/2007 |
| JP | 2010135569 A | 6/2010 |
| KR | 100763698 B1 | 9/2007 |
| KR | 20080014778 A | 2/2008 |
| WO | 9956307 A1 | 11/1999 |

* cited by examiner

BAKING DEVICE FOR A WAFER COATED WITH A COATING CONTAINING A SOLVENT

CROSS REFERENCE TO RELATED APPLICATIONS

This application claims the right of priority based on German application serial no. 10 2014 117 228.0, filed Nov. 25, 2014, which is incorporated by reference in its entirety.

FIELD

This disclosure relates generally to semiconductor manufacturing, and more specifically to a baking device for a wafer coated with a coating containing a solvent, the baking device having a baking chamber, a support for the wafer, an inlet for a purge gas, and an evacuation for the purge gas charged with solvent evaporated from the coating.

BACKGROUND

In processes for manufacturing microstructured devices such as semiconductor chips, one of the first steps is to coat a wafer with a coating containing a solvent (in some applications a photoresist). This can be done by spin coating, spray coating or other coating processes.

After the coating step, the wafer with the coating is pre-baked or softbaked to remove excess solvent from the coating. As an example, the wafer can be exposed to temperatures of 90 to 100° C. for 30 to 60 seconds while being placed on a heated support. If desired, the pressure in the chamber where the softbaking takes place can be slightly reduced below atmospheric pressure.

During the softbaking step, solvent evaporates from the coating. The solvent has to be removed from the chamber in which the softbaking takes place as it otherwise could condensate within the chamber. This could result in a drop of solvent falling onto the wafer surface which would result in a disturbance of the uniformity of the coating or even in damage to a three-dimensional structure provided on the wafer.

It is however not sufficient to simply remove the solvent from the chamber in a manner which avoids condensation. It is also essential that the concentration of the solvent immediately above the wafer is as uniform as possible since the amount of solvent there has an influence on the evaporation rate of the solvent. Therefore, a gradient in the solvent concentration along the surface of the wafer immediately above its surface would result in local deviations of the thickness of the coating after the softbaking step.

It is known to establish in the baking chamber a flow with a purge gas (typically air or $N_2$) which shall mix with the solvent and carry it towards an evacuation opening. The prior art devices, however, have certain deficits in establishing an even concentration of the evaporated solvent above the wafer.

The baking process can of course also be conducted over a longer period and/or at higher temperatures so that it would not be referred to a "softbaking" but as "baking".

SUMMARY

Disclosed is a device for baking a wafer coated with a coating containing a solvent, which ensures that the solvent evaporates from the coating in a uniform and homogeneous manner and which avoids issues with condensation of the solvent.

This is achieved by a baking device of the type mentioned above, in which the inlet is formed as a diffusion element arranged above the wafer so as to admit the purge gas evenly over substantially the entire surface of the wafer, with the evacuation being formed as an evacuation ring which radially surrounds the diffusion element and is arranged at a ceiling of the baking chamber. The device operates based on the principle of admitting the purge gas into the chamber at the same side where it is being evacuated, namely at the upper side of the chamber. Thus, a purge gas flow is established which is first generally downwardly and radially outwardly and then upwardly towards the evacuation. A first advantage of this purge gas flow is that it allows establishing a uniform concentration of solvent close to the surface of the wafer. A second advantage is that the purge gas charged with solvent is evacuated spaced from the outer walls of the chamber so that there is no risk of condensation. Still further, the solvent concentration at the ceiling above the wafer is minimal as fresh purge gas is introduced there, thereby avoiding issues with condensation of the solvent there.

According to one embodiment, the diffusion element has a large number of inlet openings distributed over the surface of the diffusion element. This ensures that the purge gas is admitted into the chamber in a homogeneous manner.

The diffusion element can be a sintered plate having a defined gas porosity. Such plate has a uniform permeability for the purge gas which allows establishing a uniform purge gas flow into the chamber.

The diffusion element can also be a plate at which the inlet openings were formed by etching, laser drilling or mechanical drilling. Such plate can be formed from sheet metal, and the inlet openings can be arranged according to a desired pattern and/or have a predefined cross section so that the purge gas flow into the chamber can be established in the desired manner.

According to one embodiment, a distribution chamber is provided behind the diffusion element. The distribution chamber establishes a volume in which the pressure of the purge gas supplied by a purge gas source equalizes so as to establish a homogeneous purge gas flow through the diffusion element. "Behind" here refers to the side of the diffusion element which is facing away from the wafer support.

Preferably, the evacuation ring is arranged radially outwardly of the wafer, thereby ensuring that the purge gas flows radially over the entire wafer before being evacuated at the ceiling of the chamber.

The diameter of the evacuation ring can correspond approximately to the diameter of the wafer support. This results in a compact design.

According to one embodiment, an annular evacuation channel formed behind the evacuation ring. The evacuation channel serves for establishing a low pressure behind the evacuation ring which is uniform along the entire circumference of the evacuation ring, thereby ensuring that the evacuation rate of the purge gas charged with the solvent is uniform along the perimeter of the wafer support. "Behind" here refers to the side of the evacuation ring which is facing away from the wafer support.

In this embodiment, a discharge system connects the evacuation channel with an exhaust system, the discharge system comprising a plurality of discharge channels connected to the evacuation channel at evenly distributed locations. The term "discharge" here refers to a system which transports the purge gas charged with solvent from the evacuation channel to the exhaust system and which comprises tubes, channels and possibly a pump.

Connecting the exhaust system to the evacuation channel at a plurality of locations ensures that the maximum length of a flow path within the evacuation channel towards the nearest discharge channel is comparatively small, preventing a pressure gradient from being established along the flow path from a particular opening in the evacuation ring towards the nearest evacuation channel.

According to one embodiment, an additional purge gas entrance to the baking chamber is provided along the perimeter of the wafer support. The additional entrance for purge gas creates a "curtain" formed from purge gas between the purge gas charged with solvent from the coating on the one hand and the walls of the chamber on the other hand, thereby preventing condensation of solvent at the walls.

If it is desired to further reduce the risk of condensation of solvent at a surface of the baking chamber, it is possible to provide a heating system for at least one of the surfaces of the baking chamber. Such heating is in particular advantageous for heating the evacuation ring as this part is exposed to the highest concentration of solvent within the baking chamber and thus to the highest risk of condensation of the solvent.

In order to accelerate evaporation of the solvent from the coating, a heating system can be incorporated into the wafer support.

BRIEF DESCRIPTION OF THE DRAWINGS

Further features and advantages will be apparent from the following description and the enclosed drawings to which reference is made. In the drawings, FIG. 1 schematically shows a baking device according to one embodiment in a cross section.

These figures depict various embodiments for purposes of illustration only. One skilled in the art will readily recognize from the following discussion that alternative embodiments of the structures illustrated herein may be employed without departing from the principles described herein.

DETAILED DESCRIPTION

Figure 1:
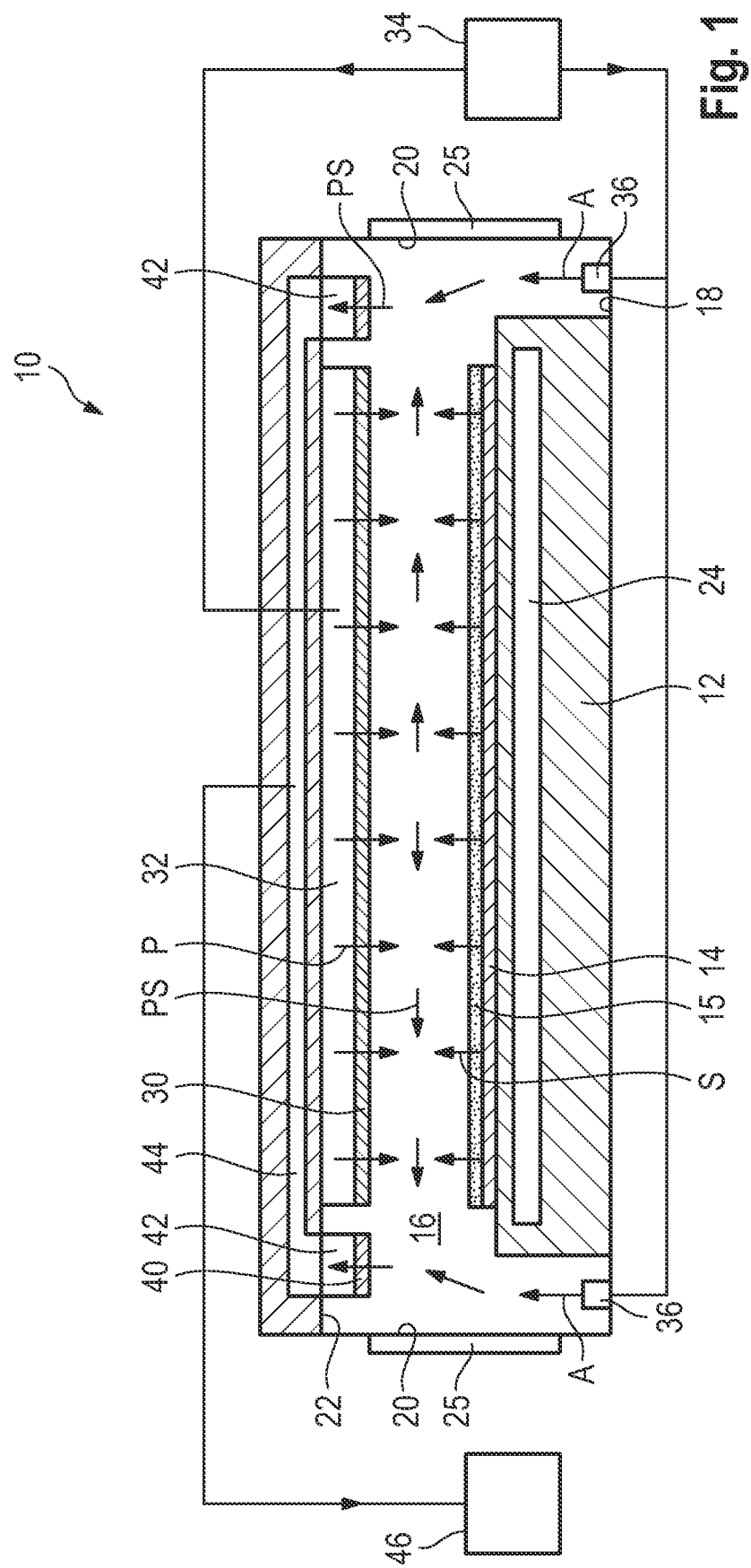

In FIG. 1, a baking device 10 is shown which has a support 12 for a wafer 14. The wafer 14 can be a semiconductor wafer and is provided with a thin coating containing a solvent (such coating with solvent referred to as "resist" 15), though the baking device 10 can be used for baking other coatings as well.

Support 12 is arranged within a baking chamber 16 which is delimited by a bottom 18, side walls 20 and a ceiling 22. A heating 24 is integrated into support 12 so that a wafer placed on support 12 can be uniformly heated.

Optionally, an additional heating 25 is associated with side walls 20.

The purpose of baking device 10 generally is to evaporate part of the solvent contained in the resist 15 after it was applied to the surface of the wafer 14. By removing part of the solvent, the viscosity of the resist 15 is increased from values which are suitable for applying the resist 15 to the wafer 14, to values which are preferred for subsequent processing.

In order to achieve a uniform, homogeneous condition of the resist 15 after the baking step, it is essential that the evaporation rate of the solvent is homogeneous over the entire surface of the wafer 14. Otherwise, the concentration of the solvent in the resist 15 would vary, and so would the properties of the resist 15.

The solvent evaporated from resist 15 is removed from baking chamber 16 by means of a purge gas (typically air or N2) which is introduced into baking chamber 16, mixes with the evaporated solvent and is then evacuated from baking chamber 16.

For introducing the purge gas, an inlet is provided which comprises a diffusion element 30 arranged at ceiling 22 of baking chamber 16. In view of wafers 14 usually being disk-shaped, diffusion element 30 has a circular shape and is arranged concentrically with support 12.

The purpose of diffusion element 30 is to introduce the purge gas evenly distributed as a homogeneous flow from the ceiling 22 into baking chamber 16. To this end, diffusion element 30 is formed as a plate which is provided with a large number of inlet openings (not visible in the Figures) which each have a small cross-section.

Diffusion element 30 can be formed as a sheet metal plate into which the inlet openings are formed by laser drilling, mechanical drilling or etching. As an alternative, it is possible to form diffusion element 30 as a sintered plate having a defined porosity for gas such that the purge gas flows through the cavities which remain after the sintering process.

Above diffusion element 30 (or "behind" the diffusion element when viewed from the support 12), a distribution chamber 32 is formed which is supplied with the purge gas from a purge gas supply 34. Purge gas supply 34 introduces the purge gas with a controlled pressure into distribution chamber 32 in which the purge gas establishes a homogeneous pressure so that it homogeneously flows through diffusion element 30.

An additional purge gas entrance 36 to baking chamber 16 is provided along the perimeter of wafer support 12. Additional purge gas entrance 36 is also connected to purge gas supply 34 and introduces purge gas in the form of an annular flow in an upward direction into baking chamber 16.

For evacuating the purge gas charged with evaporated solvent, an evacuation system is provided which comprises an evacuation ring 40. Evacuation ring 40 is arranged at ceiling 22 and extends entirely around diffusion element 30. In other words, evacuation ring 40 is arranged radially outwardly of diffusion element 30 and concentrically therewith.

Additional heating 25 can also be associated with evacuation ring 40 so as to eliminate the risk that solvent condensates here. As an example, an electrical resistance heating can be arranged on the interior surface of evacuation ring 40 so as to raise the temperature of evacuation ring 40 to a desired level.

As can be seen in FIG. 1, the diameter of diffusion element 30 substantially corresponds to the diameter of (the largest) wafer 14 placed on support 12.

The diameter of evacuation ring 40 substantially corresponds to the diameter of support 12.

Evacuation ring 40 comprises a plurality of small evacuation openings 41 (please see FIGS. 2 and 3) which lead into an annular evacuation channel 42 formed above evacuation ring 40. In other words, evacuation channel 42 is formed behind evacuation ring 40 on the side which faces away from support 12.

Figure 2:
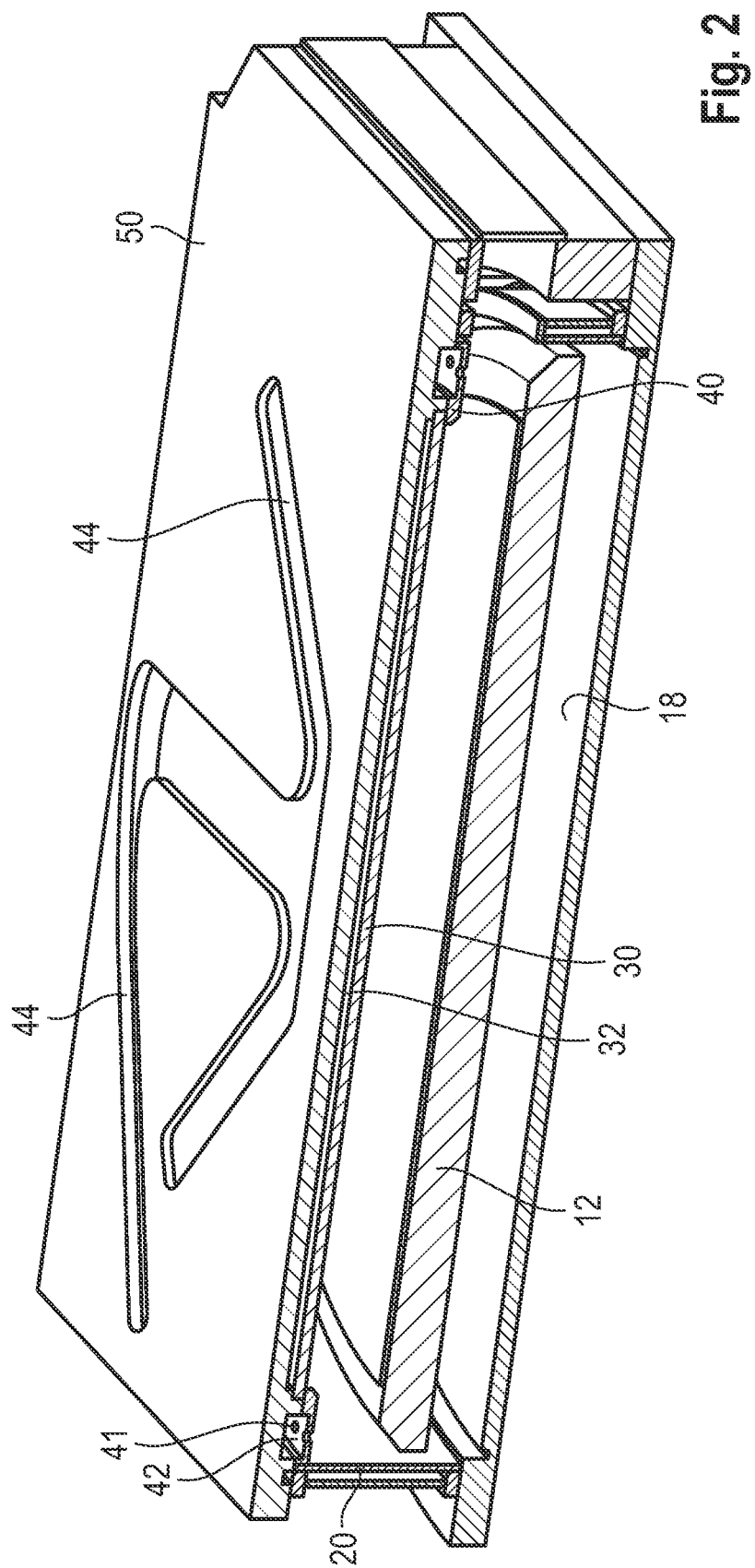
FIG. 2 schematically shows the baking chamber of the baking device of FIG. 1 in a perspective cross section.

As can be seen in FIG. 2, evacuation ring 40 can be used for clamping diffusion element 30 to a ceiling element 50 which forms the ceiling of baking chamber 16.

From evacuation channel 42, the purge gas charged with the evaporated solvent is evacuated by means of an exhaust system which comprises a plurality of exhaust channels 44 which are connected to a discharge unit 46 which applies a slight vacuum to exhaust channels 44.

The purpose of evacuation channel 42 is to ensure that the partial vacuum established by discharge unit 46 distributes evenly therein despite the fact that exhaust channels 44 withdraw the purge gas from the evacuation channel 42 at discrete locations. Accordingly, the cross-section of evacuation channel 42 must be large enough so as to prevent a pressure drop within the evacuation channel 42 because of the purge gas flowing therein towards the nearest exhaust channel 44.

Figure 4:
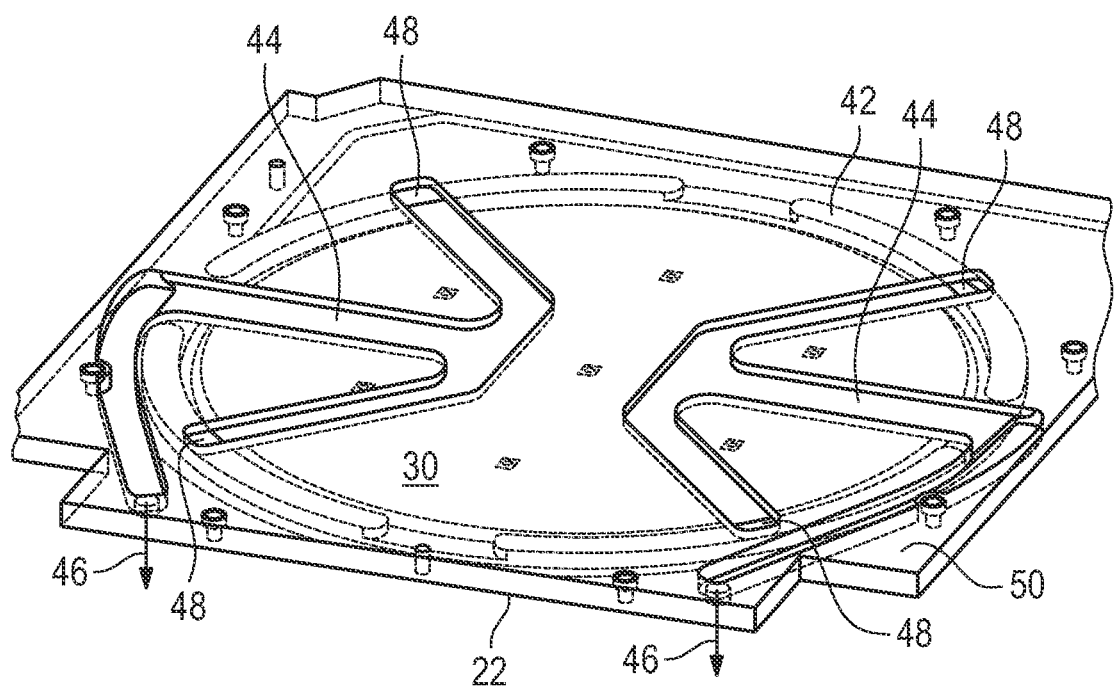
FIG. 4 schematically shows a perspective view of part of a ceiling element of the baking device of FIG. 1.

Referring now as well to FIG. 4, homogeneous pressure within evacuation channel 42 is further promoted by connecting exhaust channels 44 to evacuation channel 42 at a plurality of locations 48, namely four which are evenly spaced along the circumference of the evacuation channel 42. This ensures that the longest distance which purge gas entering into evacuation channel 42 has to flow before being discharged towards the exhaust channels 44 is 45° along the perimeter of the evacuation channel 42.

Obviously, a higher number of exhaust channels 44 can be used as well.

As can be further seen from FIG. 4 which shows a top view of the ceiling element 50 which forms ceiling 22 of baking chamber 16, evacuation channel 42 and exhaust channels 44 are integrated into ceiling element 50 which centrally comprises the diffusion element 30. Exhaust channels 44 are arranged "above" diffusion element 30 on its side facing away from baking chamber 16.

The particular shape of exhaust channels 44 serves two purposes: On the one hand, the suction effect of discharge unit 46 shall be made to deploy within evacuation channel 42 in a homogeneous manner. This requires the lengths of the exhaust channels 44 between locations 48 where the exhaust channels 44 are connected to evacuation channel 42, and the connection towards discharge unit 46 to be equal. On the other hand, the connection towards discharge unit 46 can be conveniently located where needed so as to allow replacing ceiling element 50 with a conventional design against ceiling element 50 without there being a need for significant modifications of the general layout of the baking device 10.

The baking device 10 described so far is operated in the following manner:

A wafer 14 provided with a coating of resist 15 is introduced into baking chamber 16. Baking chamber 16 is closed, and a baking timer is activated. Heating 24 is usually operated at a constant level.

Also activated is purge gas supply 34 which generates a flow of purge gas towards distribution chamber 32. From distribution chamber 32, the purge gas flows evenly distributed and in a homogeneous manner downwardly into baking chamber 16 (note arrows P in FIGS. 1 and 3).

Figure 3:
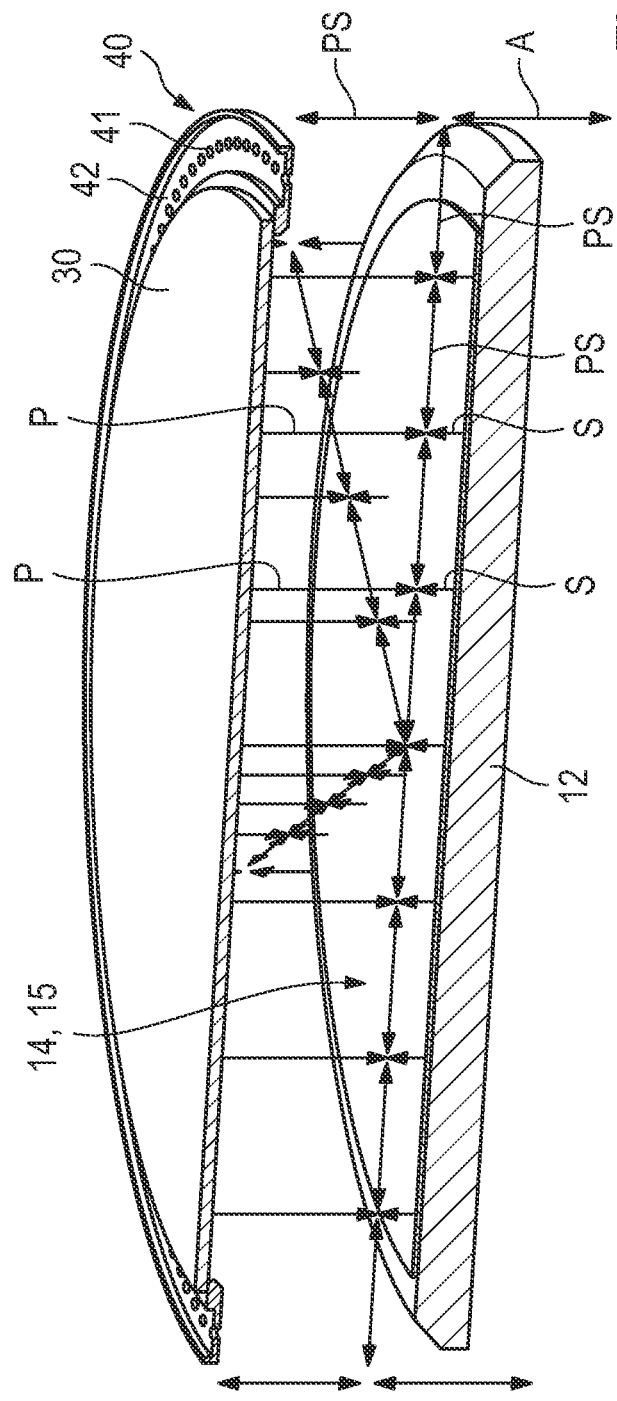
FIG. 3 schematically shows the flow of purge gas and solvent in the baking chamber of the baking device of FIG. 1.

An additional flow of purge gas enters baking chamber 16 via the additional purge gas entrance 36 (note arrows A in FIGS. 1 and 3).

As a result of wafer 14 being heated, some of the solvent present in resist 15 evaporates (note arrows S in FIGS. 1 and 3). Solvent S mixes with purge gas P and is carried with the purge gas towards evacuation ring 40 (note arrows PS in FIGS. 1 and 3) from where it is evacuated from baking chamber 16 in a homogeneous manner.

If desired, the pressure within baking chamber 16 can be slightly reduced below atmospheric pressure in order to increase the rate at which the solvent evaporates from the resist 15.

Generally speaking, a flow of purge gas is established which starts at ceiling 22 (i.e., the upper side of baking chamber 16), goes downwardly towards wafer 14 where solvent is being picked up, then radially outwardly, and is then discharged from baking chamber 16 via evacuation ring 40.

Having the purge gas entering baking chamber 16 over the entire surface of wafer 14 from the ceiling of baking chamber 16 and further evacuating the purge gas charged with solvent radially outwardly of wafer 14 at ceiling 22 of baking chamber 16 provides a plurality of advantages:

First, the concentration of solvent at ceiling 22 of baking chamber 16 above wafer 14 is minimal, thereby avoiding condensation of solvent at a point where it could fall down as a drop onto the wafer.

Second, the concentration of solvent in the purge gas is to a very large extent homogeneous over the entire surface of wafer 14. This can be understood when considering a virtual volume of purge gas introduced e.g. centrally onto wafer 14. When travelling along the surface of the wafer 14 radially outwardly, additional solvent is being picked up. At the same time, the virtual volume is "expanded" as it travels radially outwardly, and additional purge gas is added from diffusion element 30, keeping the concentration of solvent at a constant level.

Third, the flow of additional purge gas A acts as a barrier or curtain between side walls 20 of baking chamber 16 and the purge gas charged with solvent, thereby preventing condensation of solvent at the side walls 20.

Fourth, to the extent the purge gas has a cooling effect on wafer 14, this effect is homogeneous and thereby adds to the resist having a homogeneous condition after the baking step.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Persons skilled in the relevant art can appreciate that many modifications and variations are possible in light of the above disclosure. Accordingly, the disclosure of the embodiments of the invention are intended to be illustrative, but not limiting, of the scope of the invention, which is set forth in the following claims.

What is claimed is:

1. A baking device for a wafer coated with a coating containing a solvent, the baking device comprising:
    a baking chamber;
    a support for the wafer, the support being integrated within the baking chamber and configured for placement of the wafer on the support;
    an inlet for purge gas, the inlet being formed as a diffusion element arranged above the wafer so as to admit the purge gas evenly over substantially the entire surface of the wafer;
    an evacuation for the purge gas charged with solvent evaporated from the coating, the evacuation being formed as an evacuation ring radially surrounding the diffusion element and arranged at a ceiling of the baking chamber, wherein the evacuation ring provides a flow connection out of the baking chamber at the ceiling; and
    a discharge system that connects with an exhaust system, the discharge system comprising a plurality of discharge channels connected to the flow connection, wherein the plurality of discharge channels are connected to an evacuation channel formed behind the evacuation ring, wherein the evacuation channel and the plurality of discharge channels are integrated into a ceiling element which forms the ceiling of the baking chamber and which centrally comprises the diffusion element.

2. The device of claim 1, wherein the diffusion element has a plurality of inlet openings distributed over its surface.

3. The device of claim 2, wherein the diffusion element is a sintered plate having a defined gas porosity.

4. The device of claim 2, wherein the diffusion element is a plate at which the inlet openings were formed by at least one of etching, laser drilling and mechanical drilling.

5. The device of claim 1, wherein a distribution chamber is provided behind the diffusion element.

6. The device of claim 1, wherein the evacuation ring is arranged radially outwardly of the wafer.

7. The device of claim 1, wherein a diameter of the evacuation ring corresponds approximately to a diameter of the support.

8. The device of claim 1, wherein an additional purge gas entrance to the baking chamber is provided along a perimeter of the support.

9. The device of claim 1, wherein a heating system for at least one of the surfaces of the baking chamber is provided to heat the evacuation ring.

10. The device of claim 1, wherein a heating system is incorporated into the support.

11. The device of claim 1, wherein the evacuation ring has a plurality of holes formed therein.

12. The device of claim 1, wherein an annular evacuation channel is formed behind the evacuation ring.

13. The device of claim 12, wherein the discharge system connects the evacuation channel with the exhaust system, and wherein the plurality of discharge channels is connected to the evacuation channel at evenly distributed locations.

14. A baking device for a wafer coated with a coating containing a solvent, the baking device comprising:
    a baking chamber;
    a support for the wafer, the support being integrated within the chamber and configured for placement of the wafer on the support;
    an inlet for purge gas, the inlet being formed as a diffusion element arranged above the wafer so as to admit the purge gas evenly over substantially the entire surface of the wafer; and
    an evacuation for the purge gas charged with solvent evaporated from the coating, the evacuation being formed as an evacuation ring radially surrounding the diffusion element and arranged at a ceiling of the baking chamber, wherein the evacuation ring provides a flow connection out of the baking chamber at the ceiling, the evacuation ring at least partially capping an exhaust pathway out of the baking chamber, and wherein the evacuation ring clamps the diffusion element to a ceiling element which forms the ceiling of the baking chamber.

* * * * *